United States Patent [19]

Penza et al.

[11] Patent Number: 5,623,216

[45] Date of Patent: Apr. 22, 1997

[54] OUTPUT BUFFER CURRENT SLEW RATE CONTROL INTEGRATED CIRCUIT

[75] Inventors: Luigi Penza, Vimercate; Calogero Timineri, Milan, both of Italy

[73] Assignee: SGS-Thomson Microelectronics S.r.l., Agrate Brianza (MI), Italy

[21] Appl. No.: 425,000

[22] Filed: Apr. 19, 1995

[30] Foreign Application Priority Data

Apr. 24, 1994 [EP] European Pat. Off. ............. 94830190

[51] Int. Cl.$^6$ .................................................. H03K 17/16
[52] U.S. Cl. .................................. 326/27; 326/26; 326/83
[58] Field of Search .................................. 326/26–28, 83

[56] References Cited

U.S. PATENT DOCUMENTS

| | | | |
|---|---|---|---|
| 4,612,466 | 9/1986 | Stewart | 307/585 |
| 4,894,561 | 1/1990 | Nogami | 326/27 |
| 5,017,807 | 5/1991 | Kriz et al. | 326/27 |
| 5,051,625 | 9/1991 | Ikeda et al. | 326/27 |
| 5,206,544 | 4/1993 | Chen et al. | 307/443 |
| 5,248,906 | 9/1993 | Mahmood | 307/443 |
| 5,450,019 | 9/1995 | McClure et al. | 326/27 X |

FOREIGN PATENT DOCUMENTS 3240313  10/1991  Japan ............................. H03K 17/16

OTHER PUBLICATIONS

Hussein I. Hanafi et al., "Design and Characterization of CMOS Off–Chip Driver/Receiver with Reduced Power–Supply Disturbance", *IEEE Journal of Solid–State Circuits*, vol. 27, No. 5:pp. 783–790, May 27, 1992.

*Primary Examiner*—David R. Hudspeth
*Attorney, Agent, or Firm*—David V. Carlson; Harry K. Ahn; Seed and Berry LLP

[57] ABSTRACT

An output buffer current slew rate control integrated circuit includes an output buffer having first, MOS-type transistor means for supplying a current to a load impedance. Current generator means generate a constant current and are activated upon switching of an input signal of the output buffer. The current generator means drive a control input of the first transistor means for driving the first transistor means with a driving voltage having a slew rate determined by the constant current.

13 Claims, 2 Drawing Sheets

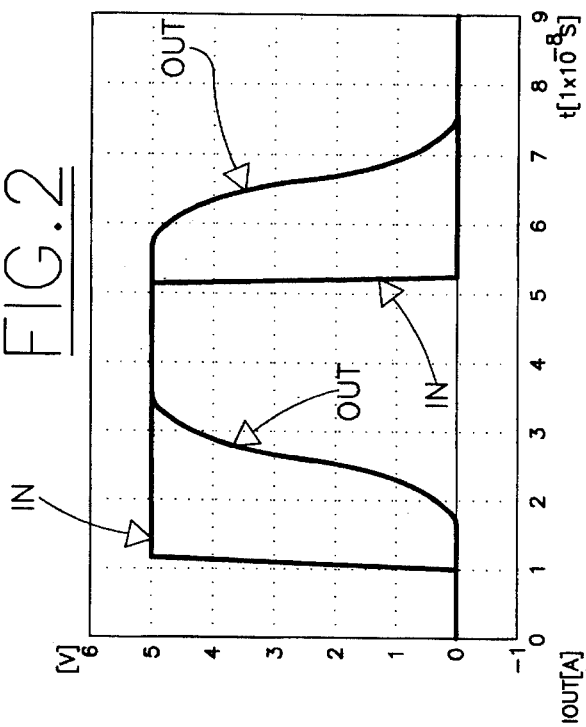
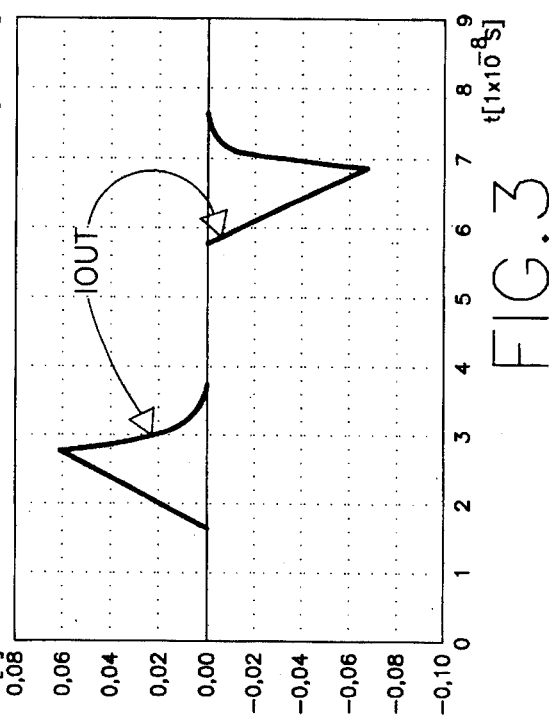
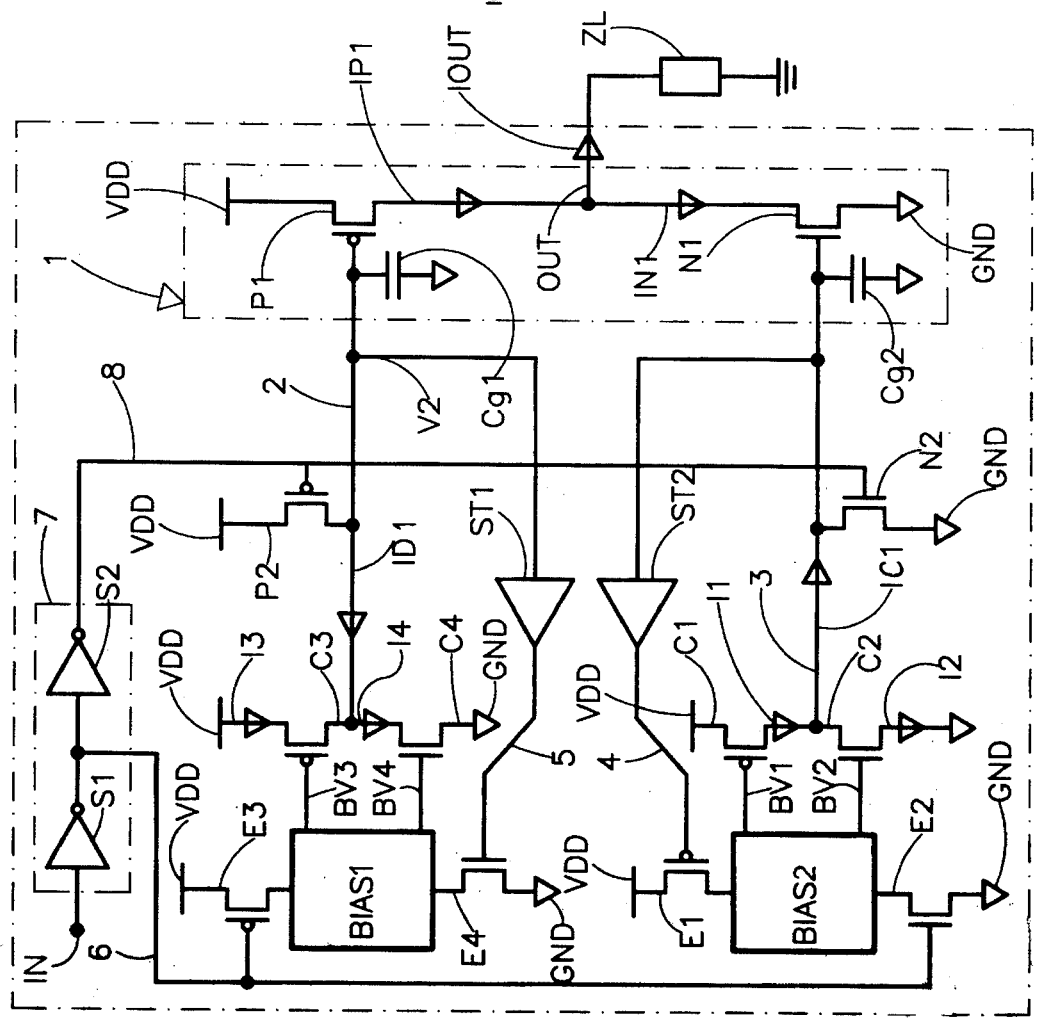

OUTPUT BUFFER CURRENT SLEW RATE CONTROL INTEGRATED CIRCUIT

TECHNICAL FIELD

The present invention relates to an output buffer current slew rate control integrated circuit.

BACKGROUND OF THE INVENTION

Output buffer circuits (also called "off-chip driver circuits") are generally provided in integrated circuit chips, wherein they constitute interface circuits for driving external load impedances which are represented by other integrated circuit inputs and by parasitic components introduced by the printed circuit board (PCB) interconnection lines.

As far as switching speed is concerned, a primary role is played by the capacitive component of an output buffer circuit load impedance. It follows that one of the main requirements of an output buffer circuit is its capability of supplying and sinking high currents.

In modern VLSI chips fabricated with sub-micron CMOS technologies, signal transition times of a few hundreds of picoseconds are common. It has therefore been possible to design output buffer circuits, substantially consisting of CMOS inverters, which can deliver current at as high a rate as 50 mA/ns.

Since, however, the internal (on-chip) power supply and ground lines which supply buffer circuits are respectively connected to the external power supply and ground voltage rails on the PCB through the chip package pins, which introduce series parasitic inductances ranging from 5 nH to 15 nH, considerable power supply voltage drops or ground voltage peaks (named "inductive switching noise voltage") are produced when such a fast current variation takes place, in accordance to the inductor equation $V=LdI/dt$. Once the cited values for L and $dI/dt$ have been introduced into the equation, noise voltage values in the range of 500 mV are obtained. The noise voltage appears as an undesired undershoot or overshoot in the internal power supply or ground voltage levels with respect to the PCB power supply or ground voltage rails, respectively, when the output buffer supplies current to or sinks current from the load.

The noise voltage thus generated is harmful under many respects. First of all, non-switching or "quiet" off-chip driver circuits which are supplied by the same internal power supply and ground lines which supply the switching off-chip driver circuit transmit the power supply and ground voltage bounces to their outputs, through low-impedance paths represented by transistors operated in the linear region; if said voltage bounces exceed a threshold level, they induce spurious transitions at the inputs of other integrated circuits. Secondly, input buffer circuits supplied by the same internal power supply and ground lines which supply the switching off-chip drivers transmit, for the same reason, the power supply and ground voltage bounces to the chip core, whose circuits are commonly supplied by separated internal power supply and ground lines, inducing spurious transitions. Thirdly, switching speed is degraded, since the voltage bounces shrink the gap between the power supply and ground voltage levels.

The inductive switching noise problem is exacerbated when more than one off-chip driver circuit switches at the same time, a circumstance which is more and more frequent in view of the increase in operating frequencies and integration of functions in the same chip. It has been recognized that four to eight simultaneously switching off-chip driver circuits, each with medium current handling capability, are sufficient to corrupt the data at the output of quiet driver circuits which are supplied by the same internal power supply and ground lines.

Switching noise is also exacerbated by reflections and ringings occurring at the output of quiet off-chip driver circuits caused by the PCB trace parasitic components. A possible solution is to provide large capacitive loads on the PCB traces to damp the voltage bounces transmitted by quiet off-chip driver circuits. While however the output loading condition can be effective in damping or magnifying noise voltage bounces at the output of quiet off-chip driver circuits, this is not the case for the switching off-chip driver circuits, since it has been recognized that peak values in the power supply voltage undershoot or ground voltage overshoot take place when the transistors constituting the switching off-chip driver circuits are still operated in the saturation region and the driver load is therefore decoupled from the internal power supply and ground lines by a relatively large impedance. Experiments have shown that the peak value of the current supplied or sinked by a driver circuit has little influence on the value of voltage bounces due to the nature of inductive noise, the most important parameter being represented by the current time derivative (current slew rate).

An obvious way to mitigate the inductive switching noise problem consists in reducing the parasitic inductances inherent to the package pins. In the practice this is achieved by providing two or more pads for the internal power supply and ground lines, which are then parallel bonded to the external power supply and ground rails. In this case, 20% to 30% of the total number of chip pads are generally dedicated to the internal power supply and ground lines. Also, special packages can be used that introduce minimum stray inductances. In both cases, high production costs are incurred.

Another way to minimize the switching noise problem aims at controlling the time derivative of the current supplied or sinked by the output buffer circuits. This can be achieved by providing control circuits that control the switching of output buffers in such a way that they supply or sink current in a controlled and specified manner under all operating conditions. Such control circuits are known as "current slew rate control circuits."

A first known solution provides for splitting each output buffer circuit in a plurality of parallel stages. The output buffer is controlled by a control circuit which achieves current slew rate control by preventing short-circuit currents ("crowbar currents") during each output buffer stage switching, and by turning on different output buffer stages in successive steps. A series connection of logic gates is used to introduce delays between the signals controlling the different off-chip driver stages.

Such a circuit allows poor current slew rate tracking over temperature, process and supply voltage variations. The control of the current slew rate dramatically deteriorates when the integrated circuit is operated in the so-called fast conditions (low temperature, high supply voltage), since the output buffer current capability increases and the logic gate propagation delay decreases. When, on the other hand, the integrated circuit is operated in slow conditions (high temperature, low supply voltage), the increase in the logic gate propagation delay causes an unacceptable increase in the switching times of the output buffers. Furthermore, the control circuit shows a dependence on the external load of the output buffer circuit: the larger the capacitive component of the external load and the longer the PCB traces, the more the output buffer stages get turned on before the output voltage completes its transition, and the higher is the current slew rate control degradation. Also, each output buffer stage is abruptly turned on, since the respective control signal, being fully amplified by the serially connected logic gates, shows low transition times; this causes the output buffer to supply or sink an irregular current, with high slew rate which induces internal power supply and ground bounces. Finally, such a control circuit has poor flexibility, being tailored for particular output buffers, and uses considerable chip area.

In a second known solution the output buffer circuits are again split in a plurality of stages, connected in parallel between the internal power supply and ground lines and with common output. Current slew rate control is achieved by exploiting the inherent RC delays in the control electrodes of the output buffer stages: the gate electrode of the P-channel and N-channel MOSFETs constituting each stage is laid out as a serpentine through the stages, so that they are turned on with delays defined by the parasitic resistance and capacitance associated with the control electrode material. Such solution shows limitations similar to those previously described.

Other solutions use feedback paths to control the switching of successive output buffer stages on the basis of the voltage levels of the output buffer output signal, instead of controlling the switching according to internally generated delays.

The presence of feedback significantly complicates the design of the physical layout of the output buffer circuits. Furthermore, if positive feedback is adopted, temperature, voltage supply and process variation tracking is compromised, while the use of negative feedback requires the off-chip loading conditions of the output buffers to be known. Such solutions therefore do not lend themselves to the design of general purpose current slew rate control circuits.

Finally, in the memory chip design field, output buffer current slew rate control circuits are known that rely on peculiar memory operating conditions. Such circuits reduce the current time derivative by precharging the output buffer load impedance to an intermediate voltage level between the power supply and ground voltage levels before the output buffer is made to switch. These circuits, however, are only exploitable if special assumptions regarding the output bus protocol can be made, and are therefore unsuitable for general purpose output buffer circuits.

SUMMARY OF THE INVENTION

In view of the state of the prior art described, the object of the present invention is to provide an output buffer current slew rate control circuit which is not affected by the above-mentioned limitations. In particular, the control circuit shall be portable over different integrated circuit designs, as a part of a library of standard cells, according to the modern development of integrated circuit design, which provides for a structured, hierarchic approach with basic logic functions, such as output buffer circuits, integrated into optimized, fully-characterized cell libraries. The working of the current slew rate control circuit shall therefore not be based on special assumptions regarding off-chip operating conditions, such as loading.

According to the present invention, this and other objects are attained by means of an output buffer current slew rate control integrated circuit. The output buffer comprises first, MOS-type transistor means for supplying a current to a load impedance. Current generator means generates a constant current and is activated upon switching of an input signal of the output buffer, and drives a control input of the first transistor means with a driving voltage having a slew rate determined by the constant current.

According to the present invention, it is possible to design an output buffer current slew rate control circuit which works under no particular assumption of the off-chip conditions, that is suited for a wide set of output buffer circuit types, and that can be integrated as a standard cell in a library to be portable over different integrated circuit designs.

BRIEF DESCRIPTION OF THE DRAWINGS

These and other features and advantages of the present invention will be made more evident by the following detailed description of two particular embodiments, illustrated as non-limiting examples in the annexed drawings, wherein:

FIG. 1 is a schematic circuit diagram of one embodiment of an output buffer current slew rate control circuit according to the present invention.

FIG. 2 is a time diagram of an output signal of an output buffer circuit controlled by the circuit of FIG. 1, with respect to an input drive signal.

FIG. 3 is a time diagram of the output current supplied and sinked by the output buffer circuit controlled by the circuit of FIG. 1.

DETAILED DESCRIPTION OF THE INVENTION

Figure 4:
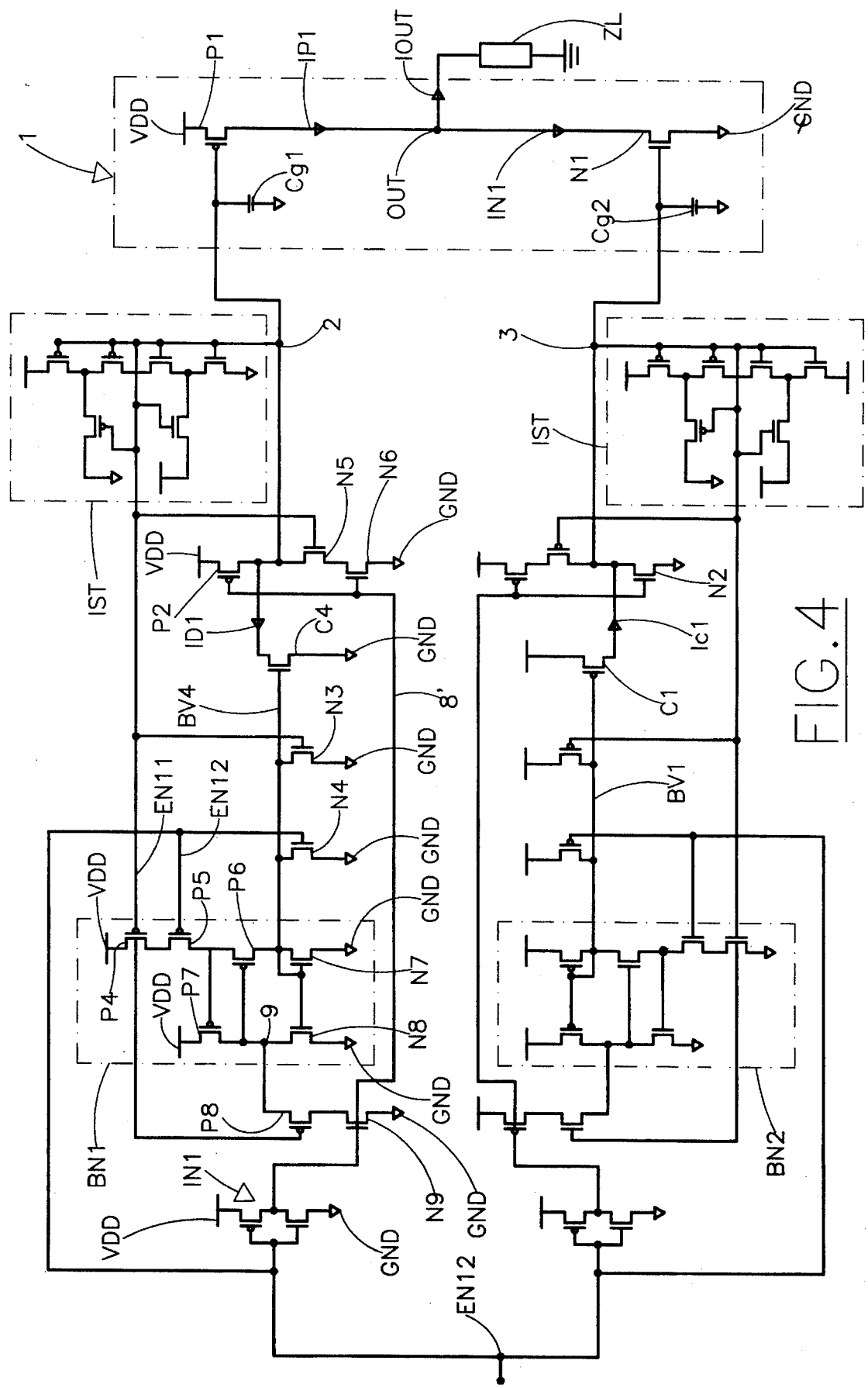
FIG. 4 is a detailed circuit diagram of another, practical embodiment of a current slew rate control circuit according to the invention.

With reference to FIG. 1, an output buffer or off-chip driver circuit is shown comprising in a per-se known way a high current capability CMOS inverter 1 made up of a P-channel MOSFET P1 (pull-up device) and by an N-channel MOSFET N1 (pull-down device) serially connected between a power supply line VDD and a ground line GND internal to the chip. The common node OUT of P1 and N1 represents an output buffer output signal, and is connected, through a respective package pin (not shown) to an external load impedance ZL on a printed circuit board (PCB).

An output buffer current slew rate control circuit according to the present invention comprises two circuit parts, one driving the pull-up device P1 (and therefore called pull-up control circuit part) and the other driving the pull-down device N1 (called for the same reason pull-down control circuit part). The two control circuit parts are dual.

The pull-up control circuit part of the current slew rate control circuit comprises a bias network BIAS1 which supplies bias gate voltages BV3 and BV4 respectively to a P-channel MOSFET C3 and to an N-channel MOSFET C4 serially connected between the internal power supply line VDD and ground line GND; the common node 2 of C3 and C4 is connected to the gate of P1. The bias network BIAS1 is connected to the power supply line VDD through a P-channel MOSFET E3 and to the ground line GND through an N-channel MOSFET E4; the activation of the bias network BIAS1 is dependent upon the activation of both E3 and E4. The gate of E4 is controlled by an output signal 5 of a Schmitt trigger ST1 whose input is connected to the node 2; the gate of E3 is controlled by an output signal 6 of a first stage S1 of a pre-driver circuit 7, substantially represented by a series of two CMOS inverters supplied by an input signal IN. A P-channel MOSFET P2 is connected between the power supply line VDD and the node 2, and has the gate controlled by an output signal 8 of a second stage S2 of the pre-driver circuit 7.

The pull-down control circuit part of the current slew rate control circuit comprises a bias network BIAS2 which supplies bias gate voltages BV1 and BV2 respectively to a P-channel MOSFET C1 and to an N-channel MOSFET C2 serially connected between the power supply line VDD and the ground line GND; the common node 3 of C1 and C2 is connected to the gate of N1. The bias network BIAS2 is connected to the power supply line VDD through a P-channel MOSFET E1 and to the ground line GND through an N-channel MOSFET E2; the activation of the bias network BIAS2 is dependent on the activation of both E1 and E2. The gate of E1 is controlled by an output signal 4 of a Schmitt trigger ST2 whose input is connected to the node 3; the gate of E2 is controlled by the signal 6. An N-channel MOSFET N2 is connected between the node 3 and the ground line GND, and has its gate controlled by the signal 8.

Assume as a starting, steady-state condition that the input signal IN and the output signal OUT are in the low or "0" logic state (instant t=0 in FIG. 2). In this situation the pull-down device N1 must be on and the pull-up device P1 must be off; this means that node 3 and node 2 must be at a logic "1".

To verify the consistency of the previous statement, it is possible to note that if node 3 is at a logic "1", the input signal of ST2 is also a logic "1", the output signal 4 of ST2 is a logic "1", and E1 is off. Further, the signal 6 and the signal 8 are respectively a logic "1" and a logic "0", N2 is off, E2 is on, the bias network BIAS2 is deactivated, and the bias voltages BV1 and BV2 are pulled to the ground voltage value; this causes C2 to be off and C1 to be in the linear region and to behave as a resistor, so that node 3 is connected to the power supply line VDD through a resistive clamp. Similarly, if node 2 is at a logic "1", the input signal of ST1 is a logic "1", the output signal 5 of ST2 is a logic "1" and E4 is on. Further, E3 is off and P2 is on; the bias network BIAS1 is deactivated, and the bias voltages BV3 and BV4 are pulled to the ground voltage value; this causes C4 to be off and C3 to be in the linear region. Node 2 is therefore connected to the power supply line VDD through both P2 and C3.

On input signal IN rising edge (instant t=10 ns in FIG. 2), the pull-down device N1 is rapidly turned off by the activation of N2, which rapidly discharges the gate capacitance Cg2 of N1; the signal 6 goes low and E2 is also turned off. When the voltage on node 3 falls below the threshold voltage of ST2, E1 is turned on; the bias network BIAS2 is still deactivated, but the bias voltages BV1 and BV2 are now pulled to the power supply voltage value, thus turning C1 off and biasing C2 in the linear region. The "1" to "0" transition of the signal 6 causes E3 to be turned on and, since E4 is also on, the bias network BIAS1 is activated. Simultaneously to the turning on of N2, P2 is turned off. The bias voltages BV3 and BV4 bias C3 and C4 in the saturation region; they therefore behave substantially as constant current source and sink, respectively, and the gate capacitance Cg1 of P1 is discharged by an almost constant discharge current ID1 equal to the difference between the drain current I4 of C4 and the drain current I3 of C3. When the voltage on node 2 falls below about ⅓ the power supply voltage value, ST1 switches and turns E4 off: the bias network BIAS1 is thus deactivated, and the bias voltages BV3 and BV4 are pulled to the power supply voltage value; this causes C3 to turn off and C4 to be biased in the linear region; more precisely, C4 is slowly changed from an almost constant current sink to a resistive clamp to the ground voltage value; the current ID1 slowly falls to zero.

As long as C4 works as an almost constant current sink, the discharge current ID1 is almost constant; this makes the voltage V2 on node 2 (i.e. the gate voltage of P1) fall almost linearly, with a slew rate VSR=dV2/dt=ID1/Cg1. Since the slew rate VSR of the gate voltage of P1 is related to the slew rate ISR of its drain current IP1 by the equation $$VSR = VDD/(a \times (Imax/ISR))$$

where Imax is the peak value of IP1 obtained when both the gate-to-source voltage V2-VDD of P1 and its drain-to-source voltage OUT-VDD equal the power supply value VDD, and a is an empirical constant which for submicron CMOS processes ranges from 1.2 to 1.3, it follows that:

$$ISR = ID1 \times (Imax/Cg1) \times (a/VDD).$$

By properly selecting the value of ID1 it is thus possible to achieve a slew rate control of the current IP1. This is clearly shown in FIG. 3. The waveform of the gate voltage V2 of P1 is actually piecewise linear: at the beginning, when P1 is still off, its gate capacitance Cg1 is small, and Cg1 discharges rapidly; then P1 is slowly turned on in the saturation region, its gate capacitance Cg1 increases, and the fall of its gate voltage V2 is controlled by the control circuit. Finally, P1 enters the linear region, and its gate voltage V2 is rapidly pulled down to the ground voltage level. It is interesting to note that, since the factor Imax/Cg1 is, to a first order, constant over different families of output buffer circuits, the current slew rate control circuit fits multiple output buffer circuit kinds.

On input signal IN falling edge (t=52 ns in FIG. 2), the pull-up device P1 is rapidly turned off by the activation of P2, which rapidly charges the gate capacitance Cg1 of P1; the signal 6 goes high and E3 is also turned off, while when the voltage V2 on node 2 exceeds the threshold voltage of ST1 E4 is turned on. The bias network BIAS1 is still deactivated, but the bias voltages BV3 and BV4 are now pulled to the ground voltage value, thus turning C4 off and biasing C3 in the linear region. The "0" to "1" transition of the signal 6 causes E2 to be turned on and since E1 is also on the bias network BIAS2 is activated. Simultaneously to the turning on of P2, N2 is turned off. The bias voltages BV1 and BV2 bias C1 and C2 in the saturation region; they therefore behave substantially as constant current source and sink, respectively, and the gate capacitance Cg2 of N1 is charged by an almost constant charge current IC1 equal to the difference between the drain current I2 of C2 and the drain current I1 of C1. When the voltage V3 on node 3 exceeds the threshold voltage of ST2, this switches and turns E1 off; the bias network BIAS2 is thus deactivated, and the bias voltages BV1 and BV2 are pulled to the ground voltage value. This causes C2 to turn off and C1 to be biased in the linear region. More precisely, C1 is slowly changed from an almost constant current source to a resistive clamp to the power supply voltage value; the current IC1 slowly falls to zero. As in the previous case, by properly selecting the value of the charge current IC1, it is possible to control the slew rate of the current IN1 sinked by N1.

The proposed control circuit achieves therefore current slew rate control by controlling the gate voltage slew rate of the pull-up and pull-down devices P1 and N1, respectively, in particular during their saturation-region working phase.

FIG. 4 is a detailed circuit diagram of another, practical embodiment of a current slew rate control circuit according to the invention. Similar to the previous embodiment, the control circuit comprises two control circuit parts, one driving the pull-up MOSFET P1 and the other driving the pull-down MOSFET N1.

The first circuit part comprises a bias network BN1 having two control inputs EN11, EN12 for controlling its activation, and one bias voltage output BV4 controlling the gate of an N-channel MOSFET C4 connected between the gate node 2 of P1 and the ground line GND. The node 2 also constitutes the input of an inverting Schmitt trigger IST (per-se known) whose output signal represents the control input EN11 of the bias network BN1. The signal EN11 also controls the gate of an N-channel MOSFET N3 connected between the bias voltage output BV4 and the ground line GND; another N-channel MOSFET N4 is connected between BV4 and GND, but its gate is controlled by the second control signal EN12. A P-channel MOSFET P2 is connected between the power supply line VDD and the node 2; two serially-connected N-channel MOSFETs N5 and N6 are connected between the node 2 and the ground line GND. The gate of N5 is controlled by the signal EN 11, while the gates of P2 and N6 are controlled by a common signal 8'.

The bias network BN1 is a so-called "bootstrap reference circuit", and comprises two circuit branches. A first circuit branch comprises three serially connected P-channel MOSFETs P4, P5 and P6 connected between the power supply line VDD and the drain of a diode-connected N-channel MOSFET N7 with its source connected to the ground line GND. The gates of P4 and P5 are respectively controlled by the signals EN11 and EN12; the drain of N7 represents the bias voltage output BV4. The second circuit branch comprises a P-channel MOSFET P7 connected between the power supply line VDD and the drain of an N-channel MOSFET N8 with its source connected to ground. The gate of P7 is connected to the common node between P5 and P6, in the other circuit branch. The common node 9 between P7 and N8 controls the gate of P6; the gate of N8 is instead connected to the gate of N7, in a current-mirror configuration. The node 9 is also connected to the ground line GND through the series of a P-channel MOSFET P8 and an N-channel MOSFET N9; the gate of P8 is controlled by the signal EN11, while the gate of N9 is controlled by the signal 8'. The signal 8' represents the output signal of an inverter IN1 whose input signal EN12 is supplied by a pre-driver circuit (not shown); the signal EN12 is therefore equivalent to the signal 6 in FIG. 1.

The second circuit part is exactly the dual of the just described first circuit part, obtained by substituting N-channel MOSFETs with P-channel counterparts, and the connections to the VDD line with connections to the GND line.

When the signal EN12 supplied by the pre-driver circuit is a logic "1" (and the signal 8' is a logic "0"), N6 is off and P2 is on, and the node 2 is pulled to VDD; P1 is off, while N1 is on, so that the output signal OUT is a logic "0". EN12 keeps N4 on, so that C4 is in the off condition. The signal EN11 is a logic "0", so that P4 in the bias network BN1 is on; further, EN11 drives P8 on. The bias network BN1 is, however, deactivated, since P5 is kept off by the signal EN12.

When the pre-driver circuit drives the signal EN12 to a "0" logic state, P5 is turned on, and the bias network BN1 becomes active; N9 is also turned on, and the node 9 is therefore pulled toward ground, so that a finite current can start flowing through P7 and N8. The current mirror N8, N7 causes a same current to flow in the other branch of BN1; the gate voltage of N7, which coincides with the bias voltage BV4, stabilizes at a level that is independent from the power supply voltage value, and which tracks process variations. The current flowing through N7 is mirrored into C4.

Since N4 has been turned off, C4 can be biased by the voltage BV4 into the saturation condition, and substantially behaves as a constant current sink. Moreover, since P2 has been turned off while N5 is still in the off condition, the gate capacitance of P1 is discharged by the almost constant drain current of C4. By properly dimensioning C4, it is possible to achieve the desired slew rate for the output current IP1. When the voltage at node 2 falls below the threshold voltage of IST, the signal EN11 goes high, turning P4 and P8 off. The bias network BN1 is deactivated, and N3 is turned on, so that C4 is turned off; EN11 turns N5 on, so that the node 2 is connected to the ground line GND through two N-channel MOSFETs N5 and N6, which are now operated in the linear region.

In the practice, C4 is represented by an array of MOSFETs which can be connected in parallel, for example, by means of metal options which can be laser-cut, to vary the discharge current ID1 and, consequently, the slew rate of IP1. Controlled current slew rates ranging from 2 mA/ns to 25 mA/ns can be obtained. If, moreover, each MOSFET constituting the current sink C4 is serially connected to a MOSFET switch, it is possible to change the current slew rate by means of digital control signals; this can be useful in special applications wherein an integrated circuit drives a signal bus switching from a high-speed condition to a low noise condition.

Furthermore, the proposed control circuit is not only suitable for CMOS inverter output buffers, but also for source followers and controlled-impedance drivers. Also, a tristate capability is inherently implemented, forcing the inputs of the two control circuit parts.

The proposed control circuit does not introduce steady-state consumption, and can be designed to work with power supply values as low as 3 V. The chip area required by the proposed control circuit is also very small.

While various embodiments have been described in this application for illustrative purposes, the claims are not so limited. Rather, any equivalent method or device operating according to principles of the invention falls within the scope thereof.

We claim:

1. An output buffer current slew rate control integrated circuit comprising:
    an output buffer including first MOS-type transistor means for supplying a current to a load impedance;
    current generator means generating a constant current, the current generator means being activated upon switching of an input signal of the output buffer between two logic states and driving a control input of said first transistor means with a driving voltage having a slew rate determined by said constant current, the current generator means including:
    second transistor means connected to said control input of the first transistor means; and
    biasing circuit means activated upon switching of the input signal of the output buffer for biasing said second transistor means in a constant current working region; and
    control circuit means for deactivating the biasing circuit means when the driving voltage of the first transistor means reaches a prescribed value.

2. The output buffer current slew rate control integrated circuit according to claim 1 wherein:
   said first transistor means includes a switching circuit comprising:
      a pull-up transistor and a pull-down transistor for electrically connecting the load impedance to a power supply line or to a ground line, respectively;
   said second transistor means includes:
      a first transistor and a second transistor connected to respective control electrodes of the pull-up and pull-down transistors; and
   said biasing circuit means includes:
      a first bias circuit and a second bias circuit for respectively biasing the first transistor and the second transistor in a constant current working region.

3. The output buffer current slew rate control integrated circuit according to claim 1 wherein the first bias circuit is activated upon switching of the input signal from a first logic state to a second logic state, and the second bias circuit is activated upon switching of the input signal from the second logic state to the first logic state.

4. An output buffer current slew rate control integrated circuit comprising:
   an output buffer including first MOS-type transistor means for supplying a current to a load impedance;
   current generator means for generating a constant current, the current generator means being activated upon switching of an input signal of the output buffer between two logic states and driving a control input of said first transistor means with a driving voltage having a slew rate determined by said constant current, the current generator means including:
      second transistor means connected to said control input of the first transistor means; and
      biasing circuit means activated upon switching of the input signal of the output buffer for biasing said second transistor means in a constant current working region;
   the first transistor means including a pull-up transistor and a pull-down transistor for electrically connecting the load impedance to a power supply line or to a ground line, respectively;
   said second transistor means including a first transistor and a second transistor connected to respective control electrodes of the pull-up and pull-down transistors;
   said biasing circuit means including a first bias circuit and a second bias circuit for respectively biasing the first transistor and the second transistor in a constant current working region; and
   control circuit means including a first Schmitt trigger and a second Schmitt trigger connected to a respective control electrode of the pull-up and pull-down transistors for respectively deactivating the first bias circuit, when the driving voltage of the pull-up transistor reaches a first prescribed value, and the second bias circuit, when the driving voltage of the pull-down transistor reaches a second prescribed value.

5. An output buffer current slew rate control integrated circuit comprising:
   an output buffer including first MOS-type transistor means for supplying a current to a load impedance;
   current generator means for generating a constant current, the current generator means being activated upon switching of an input signal of the output buffer between two logic states and driving a control input of said first transistor means with a driving voltage having a slew rate determined by said constant current, the current generator means including:
      second transistor means connected to said control input of the first transistor means; and
      biasing circuit means activated upon switching of the input signal of the output buffer for biasing said second transistor means in a constant current working region;
   the first transistor means including a pull-up transistor and a pull-down transistor for electrically connecting the load impedance to a power supply line or to a ground line, respectively;
   said second transistor means including a first transistor and a second transistor connected to respective control electrodes of the pull-up and pull-down transistor;
   said biasing circuit means including a first bias circuit and a second bias circuit for respectively biasing the first transistor and the second transistor in a constant current working region;
   wherein the first bias circuit is activated upon switching of the input signal from a first logic state to a second logic state, and the second bias circuit is activated upon switching of the input signal from the second logic state to the first logic state;
   a third transistor, driven by said input signal, for electrically connecting the control electrode of the pull-up transistor to a voltage suitable to turn the pull-up transistor off upon switching of the input signal from the second logic state to the first logic state, and
   a fourth transistor, driven by the input signal, for electrically connecting the control electrode of the pull-down transistor to a voltage suitable to turn the pull-down transistor off upon switching of the input signal from the first logic state to the second logic state.

6. The output buffer current slew rate control integrated circuit according to claim 5, wherein the pull-up transistor, the second transistor and the third transistor are P-channel MOSFETs, while the pull-down transistor, the first transistor and the fourth transistor are N-channel MOSFETs.

7. A circuit comprising:
   an external input signal having logic states;
   a constant current generator inputting said external input signal, said constant current generator outputting a constant current upon said input signal switching between said logic states, the output of said constant current generator having a voltage with a slew rate determined by said constant current; and
   a first switching circuit that switches an electrical connection of a load impedance between a power supply line and a ground line, said first switching circuit having a control input connected to said output of said constant current generator;
   wherein the constant current generator includes:
      a second switching circuit connected to said control input of said first switching circuit; and
      a bias circuit inputting said input signal, said bias circuit outputting a signal to a control input of said second switching circuit, said bias circuit biasing said second switching circuit upon switching of said external input signal such that said second switching circuit outputs a constant current.

8. The circuit of claim 7, further comprising:
   a control circuit connected to said control input of said first switching circuit and to said bias circuit, said control circuit deactivating said bias circuit when the voltage of the output of said constant current generator reaches a predetermined value.

9. The circuit of claim 8 wherein:

said first switching circuit further comprises a pull-up device that electrically connects said load impedance to said power supply line, and a pull-down device that electrically connects said load impedance to said ground line;

said second switching circuit further comprises a first switching device connected to a control input of said pull-up device and a second switching device connected to a control input of said pull-down device; and said bias circuit further comprises a first bias branch circuit that biases said first switching device and a second bias branch circuit that biases said second switching device.

10. The circuit of claim 9 wherein said control circuit further comprises:

a first control circuit device connected to said control input of said pull-up device and to said first bias branch circuit; and a second control circuit device connected to said control input of said pull-down device and to said second bias branch circuit.

11. The circuit of claim 10 wherein said first control circuit device and said second control circuit device each comprise a Schmitt trigger.

12. A method of controlling the slew rate of a current supplied by an output buffer to a load impedance, the method comprising the steps of:

supplying an external input signal having a first logic state;

generating a constant current signal upon said input signal switching to a second logic state;

driving a switching circuit with said constant current signal to supply a current to a load impedance;

wherein the step of generating a constant current further comprises the step of biasing a second switching circuit such that the second switching circuit outputs a constant current signal.

13. The method of claim 12 wherein the step of generating a constant current further comprises the step of:

deactivating the biasing of the second switching circuit when the voltage of the constant current signal reaches a predetermined value.

* * * * *